United States Patent [19]

Yang et al.

[11] Patent Number: 6,110,544

[45] Date of Patent: Aug. 29, 2000

[54] PROTECTIVE COATING BY HIGH RATE ARC PLASMA DEPOSITION

[75] Inventors: Barry Lee-Mean Yang, Clifton Park; Steven Marc Gasworth, Scotia, both of N.Y.

[73] Assignee: General Electric Company, Schenectady, N.Y.

[21] Appl. No.: 09/036,776

[22] Filed: Mar. 9, 1998

Related U.S. Application Data

[60] Provisional application No. 60/050,821, Jun. 26, 1997.

[51] Int. Cl.$^7$ .................................................. C23C 16/40
[52] U.S. Cl. .......................... 427/580; 427/576; 427/578; 427/579; 204/192.38
[58] Field of Search ...................... 427/569, 576, 427/579, 578, 580; 204/192.38

[56] References Cited

U.S. PATENT DOCUMENTS

| | | | |
|---|---|---|---|
| 3,892,882 | 7/1975 | Guest et al. | 427/34 |
| 4,505,947 | 3/1985 | Vukanovic et al. | 427/452 |
| 4,674,683 | 6/1987 | Fabel | 239/13 |
| 4,749,587 | 6/1988 | Bergmann et al. | 427/570 |
| 4,842,941 | 6/1989 | Devins et al. | 428/412 |
| 4,866,240 | 9/1989 | Webber | 219/7 |
| 4,871,580 | 10/1989 | Schram et al. | 427/38 |
| 4,882,465 | 11/1989 | Smith et al. | 219/121.48 |
| 4,927,704 | 5/1990 | Reed et al. | 428/221 |
| 4,948,485 | 8/1990 | Wallsten et al. | 204/164 |
| 4,957,062 | 9/1990 | Schuurmans et al. | 118/723 DC |
| 5,051,308 | 9/1991 | Reed et al. | 428/412 |
| 5,120,568 | 6/1992 | Schuurmans et al. | 427/37 |
| 5,156,882 | 10/1992 | Rzad et al. | 427/489 |
| 5,298,587 | 3/1994 | Hu et al. | 528/10 |
| 5,320,875 | 6/1994 | Hu et al. | 427/493 |
| 5,340,621 | 8/1994 | Matsumoto et al. | 427/571 |
| 5,356,674 | 10/1994 | Henne et al. | 427/449 |
| 5,358,596 | 10/1994 | Cappelli et al. | 117/99 |
| 5,433,786 | 7/1995 | Hu et al. | 118/723 |
| 5,494,712 | 2/1996 | Hu et al. | 427/489 |
| 5,560,779 | 10/1996 | Knowles et al. | 118/723 MP |
| 5,618,619 | 4/1997 | Petrmichl et al. | 428/334 |
| 5,718,967 | 2/1998 | Hu et al. | 428/216 |
| 5,846,330 | 12/1998 | Quirk et al. | 118/723 DC |
| 5,853,815 | 12/1998 | Muehlberger | 427/446 |

FOREIGN PATENT DOCUMENTS

| | | |
|---|---|---|
| 0223104 | 5/1987 | European Pat. Off. . |
| 0394735 | 10/1990 | European Pat. Off. . |

OTHER PUBLICATIONS

D.A. Gerdeman et al., "Arc Plasma Technology in Materials Science", 1–17 (1972) (no month).
Yang, U.S. Ser. No. 09/033,862, filed Mar. 3, 1998.
Yang, U.S. Ser. No. 60/050,837, filed Jun. 26, 1997.
Iacovangelo, U.S. Ser. No. 60/050,820, filed Jun. 26, 1997.

*Primary Examiner*—Timothy Meeks
*Attorney, Agent, or Firm*—Tyler Maddry; Noreen C. Johnson

[57] ABSTRACT

A method for depositing adherent metal oxide-based protective coatings on glass, metal, and plastic substrates by arc plasma deposition.

47 Claims, No Drawings

PROTECTIVE COATING BY HIGH RATE ARC PLASMA DEPOSITION

This application claims the benefit of U.S. Provisional Application No. 60/050,821, filed Jun. 26, 1997.

This invention relates to deposition of protective coatings or films on various substrates such as glass, metals, and plastics. More particularly the invention is directed to adherent protective coatings on plastic surfaces such as sheets, films, and shaped articles. Coatings which are abrasion resistant and protect against radiation damage to the plastic substrate are provided by the invention disclosed herein. The term protective coating means one or more layers of deposited material which provides protection against abrasion and UV degradation and reflects IR radiation.

BACKGROUND OF THE INVENTION

The technological importance of thin films has led to the development of a variety of deposition methods. Chemical vapor deposition (CVD) produces a solid film on a substrate surface by thermal activation and surface reaction of gaseous reagents which contain the desired constituents of the film. Energy required to pyrolyze the reactants is supplied by heating the substrate. For reasonable reaction rates the substrate is heated to relatively high temperatures in the range of about 500° to 2000° F. degrees. These temperatures preclude application of the process to heat sensitive substrate materials.

Plasma enhanced chemical vapor deposition (PECVD) supplies energy to the reactants by an electrical discharge in a gas which forms a plasma in the deposition chamber. Generally the substrate is immersed in the plasma.

Polycarbonate is often the engineering material of choice for glazing and optical applications because of its high impact strength, low density, optical clarity, and good processibility. However, the polycarbonate material is soft, lacks glass-like abrasion resistance, and is sensitive to temperatures above about 300° F. Prior work had shown that a silicon oxide coating by plasma-enhanced chemical vapor deposition (PECVD) can improve the abrasion resistance of polycarbonate, qualifying it for glazing applications. However, the prior PECVD technology using silane and nitrous oxide as the precursors was slow and therefore uneconomical, having a typical deposition rate of only about 0.05 microns per minute. Organosilicon precursors were later used in PECVD for a plasma-generated abrasion-resistant polymer coating, but the deposition rate was not significantly improved.

SUMMARY OF THE INVENTION

A plasma arc method for preparing a clear weather stable protective coatings on polycarbonate (PC) has been developed. The coating can be essentially stoichiometric silicon dioxide or silicon oxide-based which contains small amounts of carbon and hydrogen. The term "silicon oxide-based" as used herein means a material which comprises oxides of silicon and small amounts of carbon and hydrogen, organic residue from the organosilicon compounds used to form the material. The coating imparts glass-like abrasion resistance to the polycarbonate article. The coating was deposited at rates of up to about 20 microns per minute at a reduced pressure with oxygen and an organosilicon compound such as hexamethyldisiloxane (HMDSO) injected into an argon plasma generated by an arc plasma torch. In the practice of this invention the surface to be coated is positioned in the path of the active species generated by the plasma as they pass into and through the deposition or coating chamber of the apparatus.

The polycarbonate substrate surface can be pretreated with a primer interfacial layer before deposition of the abrasion resistant coating material. The term "substrate", as used herein, refers to a structure such as a sheet or film which acts as the base or support for the material which forms the coating or is one of a series of coatings. Generally, the substrate, although it can be a thin film, is relatively thick compared to the thickness of the coating.

This invention comprises methods for high-rate deposition of silicon oxide-based weather-stable, abrasion-resistant, and radiation-stable protective coatings on plastics such as polycarbonate. The term "high rate" deposition refers to deposit of coatings at a rate greater than about 5 microns per minute. The coatings must be optically clear and abrasion resistant and may satisfy other functional requirements such as providing infrared or ultraviolet protection, and adhesion improvement. The coating process must be operative at temperatures below the thermal damage threshold, generally the glass transition temperature, of the plastic substrate or an intermediate functional layer, such as an ultraviolet radiation absorbing layer, on which the coating or coatings are deposited. It is preferred to operate with the substrate at a temperature at least 20° C. below the glass transition temperature, e.g. about 135° C. for polycarbonate substrates.

A plasma deposition method for coating abrasion resistant coatings on plastic using an expanded thermal plasma of argon generated by an arc plasma torch and injecting an organosilicon precursor and oxygen into the plasma as it exits the torch to deposit a silicon oxide-based coating under reduced pressure on the target surface has been developed. Polycarbonate film (10 mil thick) and sheet (0.125"-thick) pre-coated with about 4 to 8 microns of a silicone hardcoat were coated with silicon oxide-based using the plasma deposition method of this invention without direct cooling of the substrate. Optically clear coatings free of microcracks were produced without thermal damage to the substrate. The silicon oxide coating greatly improved the abrasion resistance of the composite as evidenced by Taber abrasion tests. The term "composite" refers to the substrate with its silicon oxide-based abrasion resistant coating and any other functional coatings which may be present.

A water-cooled arc with a 4 mm cylindrical bore was used to deposit the coatings as described herein. The arc generator consists of a copper anode separated from 3 needle cathodes of thoriated tungsten by at least one electrically isolated metal plate. With argon flowing, a dc voltage is applied to the electrodes to generate a plasma. The plasma expands through a diverging or bell-shaped nozzle-injector into a deposition chamber maintained at a reduced pressure by a vacuum pump. The stainless steel nozzle-injector has two or more shower-ring gas distributors for the injection of reactive gases into the argon plasma stream. The nozzle-injector is heated to a temperature sufficient, e.g., about 200° C., to avoid condensation of reactive gas organosilicons such as HMDSO. The substrate is mounted on the jet axis by means of a metal stage at a working distance of about 15 to 70 centimeters from the anode. A retractable shutter can be inserted between the mounting stage and the nozzle to regulate the exposure of the substrate to the plasma. Polycarbonate and silicon hardcoated polycarbonate substrates can be prepared for deposition coating by washing with isopropyl alcohol and vacuum drying at about 80° C. to remove volatile contaminants.

The bore or central channel of the plasma torch need not be cylindrical. The bore can be cone shaped, widening as it approaches the discharge end of the torch.

In a typical deposition procedure the argon plasma is established with a manually or automatically controlled blockade or shutter inserted between the plasma source and the substrate. Oxygen is then introduced into the plasma to produce an oxygen/argon plasma. The shutter is retracted and the substrate is exposed to the oxygen/argon plasma for a short time, up about 30 sec, before the organosilicon reagent such as HMDSO, is introduced into the plasma for silicon oxide deposition over a period ranging from about 3 to 30 seconds. Table 1, below, shows the deposition rate for several deposition conditions. In general, the heat load on the substrate can be reduced by lowering the argon flow, by increasing the working distance as measured from the anode, and by lowering the arc power. Condition G70 allows an exposure of 60 sec without thermal damage to a 0.125" thick sheet of polycarbonate having a silicon hardcoat surface layer. Condition G71 permits an exposure of 15 sec without thermal damage to a 10 mil thick polycarbonate film.

TABLE 1

Illustrative coating conditions and deposition rates

| Substrate | unit | G71 PC film | G70 MR5* | G66 Glass | G67 Glass | G64 Glass | G59 Glass |
| --- | --- | --- | --- | --- | --- | --- | --- |
| Argon flow rate | l/min | 1.5 | 2.0 | 3.0 | 4.0 | 6.0 | 6.0 |
| Oxygen flow rate | l/min | 0.5 | 0.5 | 0.5 | 0.5 | 0.5 | 1.0 |
| HMDSO flow rate | l/min | 0.12 | 0.12 | 0.12 | 0.12 | 0.12 | 0.12 |
| Working distance | cm | 38 | 38 | 35 | 38 | 38 | 33 |
| Chamber pressure | torr | 0.24 | 0.28 | 0.33 | 0.41 | 0.55 | 0.59 |
| Arc power | Kwatt | 4.19 | 4.38 | 4.53 | 4.71 | 5.00 | 4.95 |
| Deposition rate | $\mu$/min | 5 | 8 | 8 | 8 | 14 | 16 |

*Polycarbonate with a silicone hardcoat

Table 2 compares the abrasion resistance of two polycarbonate samples (0.125" thick) with and without silicon oxide-based coating deposited as disclosed herein and that of an uncoated glass plate. Haze was measured by using a Pacific Scientific XL-835 colorimeter before and after the sample is abraded on a Teledyne Taber 5150 abrader (two CS10F wheels, 500 g each) for a number of cycles. Note the essentially glass-like abrasion resistance of the sample with the 1.3 $\mu$m silicon oxide coating. The colorimeter was zeroed with an open path (no solid sample) before use. The negative readings at 0 cycles (before Taber abrasion) are artifacts of the calibration procedure.

TABLE 2

Abrasion resistance of Polycarbonate with and without PECVD silicon oxide surface coating

| | % Haze | | | | |
| --- | --- | --- | --- | --- | --- |
| Sample | 0 | 100 | 300 | 600 | 1000 cycles |
| PC w/ silicone hardcoat | −0.6 | 2.3 | 5.7 | 12.1 | 16.2 |
| PC with 1.3$\mu$ silicon oxide plasma coating | −0.3 | 0.8 | 1.3 | 1.4 | 1.9 |
| Glass | −0.7 | 0.5 | 1.1 | 1.7 | 1.7 |

High rate deposition of a continuously-graded or a discretely-graded transparent coating on plastic resin substrate, e.g. polycarbonate, was achieved by using a wall-stabilized plasma arc system of this invention. The coating was deposited at a rate of about 8 microns per minute at a reduced pressure, with oxygen and an organosilicon compound as the reagents. Gradation was achieved by varying the feed rate of oxygen, the organosilicon reagent, or both. These graded coatings are characterized by gradual transition from a composition which is essentially an interfacial material to a composition which is substantially an abrasion-resistant material. An interfacial material is one which is situated between the substrate surface and the abrasion-resistant material. In general the interfacial material has chemical and physical characteristics which make it compatible with and adherent to both the substrate and the abrasion-resistant material. The coating greatly improves the abrasion resistance of the coated polycarbonate composite.

A continuously graded coating was deposited by varying the feed rate continuously throughout the coating process. A discretely graded coating was made by changing the flow rate in a step fashion. It was demonstrated that an arc plasma could be operated smoothly with such changes in reagent feed rates, and both the gradation layer and the abrasion-resistant layer at the top surface of the coating could be made in an integrated process. A deposition rate of about 8 microns per minute was typical. Good abrasion resistance was achieved with a 3 $\mu$m thick abrasion-resistant layer on a proper gradation layer on polycarbonate.

Suitable silicon-containing reagents include silane, disilane, or organosilicon compounds like tetramethyldisiloxane (TMDSO), hexamethyldisiloxane (HMDSO), tetraethyl orthosilicate, hexamethyldisilane, octamethylcyclotetrasiloxane (D4), and tetramethylcyclotetrasiloxane. The oxidant can be oxygen or nitrous oxide.

In a typical deposition procedure the argon plasma was established with the shutter inserted between the substrate and the nozzle-injector. Oxygen was then introduced to the nozzle-injector to produce an oxygen/argon plasma. The shutter was retracted and the substrate was exposed to the oxygen/argon plasma for a short time before the silicon-containing reagent was introduced downstream from the oxygen injection point to initiate deposition over a period ranging from about 3 to 60 sec. The feed rates of both HMDSO and oxygen could be varied during deposition to change the coating properties. Typically, low oxygen/HMDSO ratios were used for the gradation portion of the coating and high oxygen/HMDSO ratios were used for the abrasion-resistant top or outermost layer.

In Table 3 the abrasion resistance of coated polycarbonate samples (0.125" thick) with and without gradation is compared. Haze was measured by using a Pacific Scientific XL-835 calorimeter before and after the sample was abraded on a Teledyne Taber 5150 abrader (two CS10F wheels, 500 g each) for the indicated number of cycles.

TABLE 3

Coatings on Polycarbonate and Their Performance in Taber Abrasion Resistance Measurements

| No. | Gradation | Flow rate (l/min) Ar/O2/HMDSO | Coating thickness ($\mu$) Graded | Abrasion | Initial haze (%) | % Δhaze after Cycles 600 | 1,000 |
|---|---|---|---|---|---|---|---|
| G96 | none | 2/0.62/0.12 | 0 | 2 | 0.7 | 49 | — |
| G115 | discrete | 2/0.16–0.62/0.12 | 2 | 3 | 1.7 | 0 | 1.6 |

This invention provides a method for preparing clear silicon oxide-based coatings at high rates by plasma arc deposition. Demonstration of the method uses silane or an organosilicon compound as the silicon source, and oxygen or nitrous oxide as the oxidant. Deposition rates up to about 30 microns per minute were achieved.

This embodiment of the invention is a method for high-rate deposition of silicon oxide. Prior work had shown that a silicon oxide coating can be made by plasma-enhanced chemical vapor deposition (PECVD). Coatings so prepared showed good gas-barrier properties useful for food and medical packaging, added abrasion resistance to polycarbonate and other plastics, dielectric properties suitable for an insulator in integrated circuits, and protective function for anti-corrosion applications. However, the prior art PECVD process is slow, with a typical deposition rate of about 0.05 microns per minute. It is very important to develop a high-rate deposition method of protective coating which improves the coating economics.

A method of making silicon oxide coatings at high rates was developed by using a wall-stabilized plasma arc, as described herein, which comprises generating an argon plasma jet in a vacuum chamber, injecting a silicon-containing precursor and an oxidant into the plasma jet, and impinging the jet or the residue of the jet and its reactive species on a substrate situated in a reduced-pressure environment. The reactant gases are injected into the plasma jet at a point beyond the plasma generator, i.e. after the jet has exited the generator.

In a typical deposition procedure the argon plasma was established with the shutter inserted between the substrate and the nozzle-injector. Oxygen or nitrous oxide was then introduced to the nozzle-injector to produce an oxygen/argon plasma. The shutter was retracted and the substrate was exposed to the oxygen/argon plasma for a short time (1 to 30 sec) before the silicon-reagent was introduced downstream from the oxygen to initiate silicon oxide deposition. Table 4 lists coating conditions and the corresponding deposition rates. The major constituents of the coatings are silicon and oxygen, although carbon and hydrogen are also present, in small amounts in some samples.

TABLE 4

Coating Conditions and Deposition Rates

| | Unit | G39 | G59 | G241 | G253 |
|---|---|---|---|---|---|
| Argon flow rate | l/min | 3.0 | 6.0 | 1.0 | 1.0 |
| Oxidant | | N2O | O2 | O2 | O2 |
| Silicon reagent | | 2% SiH$_4$/Ar | HMDSO | TMDSO | D4 |
| Working distance | cm | 38 | 33 | 25.5 | 25.5 |
| Chamber pressure | torr | 0.33 | 0.59 | 0.15 | 0.16 |
| Arc voltage | V | 82.5 | 42.5 | 41.5 | 41.5 |
| Arc current | A | 61.5 | 60.0 | 60.5 | 61.0 |
| Deposition rate | $\mu$m/min | 1 | 16 | 12 | 24 |

The high-rate deposition system of this invention was designed to deposit thin-film coatings on both high and low temperature substrates, including plastics. The system consists of a vacuum chamber with an arc torch for plasma generation, plasma gas and reactant gas injection means, a nozzle-injector for injection, activation and reaction of chemical reagents, a substrate stage, and a pumping station to provide the reduced pressure for the vacuum chamber.

This method was used to deposit abrasion-resistant coatings of silicon oxide, from various silanes or siloxanes and oxygen or nitrous oxide. Titania coatings can be deposited from titanium isopropoxide and oxygen. Zinc oxide can be deposited from diethyl or dimethyl zinc with oxygen. Diamond-like carbon coatings can be deposited from various hydrocarbons. Substrate materials included metal, glass, metallized glass, and plastics.

Various coatings were deposited by using the arc plasma deposition system. They include abrasion-resistant coatings from various siloxanes and oxygen, silica coatings from silane and nitrous oxide, titania coatings from titanium isopropoxide and oxygen, and diamond-like carbon coatings from various hydrocarbons. Substrate materials include metal, glass, metallized glass, and plastics such as polycarbonate, with and without a silicone hardcoat. Clear, abrasion-resistant coatings, 30 cm×30 cm in area with a deposition rate of 30 $\mu$m/min at the center, were demonstrated. The coating greatly improves the abrasion resistance of polycarbonate.

A water-cooled cascaded arc with either a cylindrical or a divergent arc channel was used. The arc generator consisted of a copper anode separated from 3 needle cathodes of thoriated tungsten by from 1 to 8 electrically isolated copper disks. With argon flowing, a DC voltage was applied to the electrodes to generate a plasma. The plasma expanded through a conical nozzle-injector into a chamber maintained at a reduced pressure, thus forming a plasma jet. The nozzle-injector had several shower-ring gas distributors having from 8 to 32 holes each evenly distributed or slit-ring injectors for the injection of gas/vapor into the argon plasma jet. The oxygen injector was upstream from the siloxane injector. The nozzle-injector was heated to about 200° C. to avoid condensation of the high boiling point reagents such as HMDSO and titanium isopropoxide. A polycarbonate substrate was supported in the jet axis by means of a temperature-controlled copper stage at a working distance of about 15 to 70 centimeters from the anode. A retractable shutter was used to regulate the exposure of the substrate to the plasma. Polycarbonate and polycarbonate with silicone hardcoat substrates were washed with isopropyl alcohol and vacuum dried at about 80° C. before use for deposition.

As previously the argon plasma was established with the shutter inserted between the substrate and the nozzle-injector. Oxygen was introduced to the nozzle-injector to produce an oxygen/argon plasma. The shutter was retracted and the substrate was exposed to the oxygen/argon plasma for a short time (0 to 30 sec) before a siloxane such as HMDSO or D4 was introduced downstream from the oxygen to initiate deposition over a period of time ranging from about 3 to 30 sec. A deposition rate of 10–30 microns per minute was typical, with no thermal damage to the polycarbonate substrate. Polycarbonate films as thin as 10 mils have been coated. The coating greatly increased the abrasion resistance of the polycarbonate, exhibiting a haze increase of less than about 2% after 1,000 cycles of Taber abrading by a pair of CS10 F wheels with a load of 500 g per wheel.

Other coatings deposited include zinc oxide, titanium oxide, and diamond-like carbon. The titanium oxide and zinc oxide coatings demonstrated a UV-filtering capability. The diamond-like carbon coating exhibited superior dielectric properties with a breakdown strength in the range of 300–400 V/$\mu$m.

Clear titanium oxide coatings on polycarbonate surfaces were prepared at low temperatures by plasma arc deposition. The coating was typically deposited at a rate of about 0.2 microns per minute at a reduced pressure with oxygen and titanium isopropoxide being injected into an argon plasma generated by a cascaded arc.

Transparent titanium oxide coatings have been used on optical lenses on UV-sensitive plastics for UV filtering, and as a component in stack coatings for IR reflection in glazing applications. The coating can be made by metal organic chemical vapor deposition (MOCVD), reactive sputtering, and plasma-enhanced chemical vapor deposition (PECVD). MOCVD requires the substrate be heated to about 400° C., thus can only be applied to high-temperature substrates such as glass. Reactive sputtering or PECVD can be operated at lower temperatures, but the deposition rate is low at about 0.01–0.05 microns per minute.

The method of this invention provides high-rate deposition of metal oxide films such as titanium and zinc oxides on substrates such as glass metal, and plastics.

Titanium oxide coatings were deposited at high rates and low temperatures by using an argon plasma jet in a vacuum chamber, injecting an organotitanium reagent and oxygen into the plasma jet, and directing the jet to a substrate situated in a reduced pressure environment. Optically clear titanium oxide coatings were obtained with no microcracks. The UV-filtering capability of the coating was demonstrated.

The wall-stabilized plasma arc with a cylindrical bore, previously described, was used. The stainless steel nozzle-injector had two shower-ring gas distributors having 8 to 16 holes each for the injection of gas/vapor into the argon plasma jet. A retractable shutter was used to regulate the exposure of the substrate to the plasma. The argon plasma was established with the shutter inserted between the substrate and the nozzle-injector. Oxygen was introduced to the nozzle-injector to produce an oxygen/argon plasma. The shutter was retracted and the substrate was exposed to the oxygen/argon plasma for a short time, generally up to about 30 seconds, before titanium isopropoxide was introduced downstream from the oxygen to initiate titanium oxide deposition over a period ranging from 1 to 2 minutes. Although glass was used as the substrate, essentially similar coating conditions can be used for coating deposition on polycarbonate without causing thermal damage to the plastic. In one example, the titanium oxide coating of about 0.5 $\mu$m thick was made at a deposition rate of about 0.23 microns per minute. The coating was transparent. Its UV filtering capability was confirmed by UV-visible spectroscopy. The coating was chemically stable in warm water soak test. No haze increase was observed after the coating was immersed in 65° C. water for 15 days.

Zinc oxide coatings have been deposited on glass, quartz, and polycarbonate substrates using diethyl zinc and oxygen as reagents. The UV filtering capability of the resulting coating was demonstrated.

A cylindrical vacuum chamber 0.7 m in diameter and 1 m long is oriented horizontally. At one end is a 0.7 m swing-open door for access to the inside of the chamber. An arc generator is mounted at the center of the door outside of the chamber and is electrically supported by a power supply and a starter. A nozzle-injector is attached to the arc from inside the chamber, and various feedthroughs are used to penetrate the door for vapor and gas delivery and electrical heating to support the nozzle-injector. The vapor lines and the nozzle-injector are kept at about 150° C. by heating tapes to avoid vapor condensation. A vertical copper substrate stage with forced liquid circulation for temperature control is on wheels and is movable along rails for working distance adjustment. A molybdenum shutter is placed between the nozzle-injector and the substrate stage. It is mounted to a movable (linear motion) feedthrough for insertion and retraction. At the other end of the chamber is a 12" flange leading to a throttling gate valve and a pumping station consists of two Roots blowers in series backed by a mechanical vacuum pump.

Polycarbonate sheet 4" square, 1/8" thick was used as the substrate. Other substrates used include glass slides, silicon wafers, polycarbonate sheets and films, polyimide films graphite sheet, carbon steel coupons and epoxy-coated glass. The substrate can be prepared by first removing any masking films, washing the substrate twice with isopropyl alcohol to remove any residue of the adhesive, and baking in vacuum at 80° C. It is then taken out of the vacuum oven and quickly mounted to the substrate stage preheated to 80° C. or other pre-set temperatures. The door is closed and the chamber is pumped down by opening the roughing valve to the mechanical pump. When a partial vacuum (10 torr) is reached, the gate valve is opened and the Roots blowers are turned on to establish full pumping.

With the shutter inserted, the arc is ignited with argon flowing. Oxygen is then introduced through the nozzle-injector to produce an oxygen/argon plasma. The shutter is retracted and the substrate is exposed to the oxygen/argon plasma for a period of time, typically 0 to 10 sec, for pretreatment. After that, the silicon reagent is introduced into the injector downstream from the oxygen injector to initiate deposition. The deposition lasts from a few seconds to a few minutes, depending on the deposition rate and the coating thickness targeted, and is ended by shutting off the silicon reagent. The coating is post-treated by oxygen/argon plasma for a period of time, typically 0 to 10 sec, before the arc is extinguished. Listed in Table 7 are typical operating conditions and the corresponding deposition results.

A particularly preferred silicon reagent is octamethylcyclotetrasiloxane, identified herein as D4. Coatings prepared from this precursor exhibited a surprising improvement in UV stability. The low absorbance of the coating at several wavelengths correlates well with superior performance in accelerated weathering tests. With other organosilicon reagents such as TMDSO abrasion resistance generally degrades after 1000 hours of exposure. See Tables 5 and 6, below.

TABLE 5

UV Absorbance of D4 and TMDSO Coatings at 5 $\mu$m Thickness

| Wavelength (nm) | D4 coating G339 | TMDSO coating G168 |
| --- | --- | --- |
| 300 (UVB) | 0.012 | 0.057 |
| 325 | 0.012 | 0.040 |
| 350 (UVA) | 0.007 | 0.031 |

G339 deposited at 0.04 torr; G168 at 0.21 torr

TABLE 6

Taber Abrasion Resistance of D4 and TMDSO Coatings before and after QUVB

| Coating | Thickness ($\mu$) | Precursor | Deposition Pressure (torr) | QUVB (hours) | $_\Delta$Haze @ 1,000 cycles 500 g each |
| --- | --- | --- | --- | --- | --- |
| G285-6 | 1.3 | TMDSO | 0.11 | 0 | 3.7% |
| G265-3 | 1.3 | TMDSO | 0.11 | 1,200 | 6.8% |
| G297 | 2.0 | D4 | 0.03 | 0 | 1.6% |
| G310-1 | 1.9 | D4 | 0.04 | 1,000 | 1.4% |

All coatings were deposited on polycarbonate substrates with silicon hardcoat surface.

In other examples (G295, G296), the isopropyl alcohol wash and vacuum baking of the samples were omitted and the deposition was done at room temperature. No loss of deposition rate or the abrasion resistance of the coating was observed (vs. G297).

Chemical reactions take place during the deposition process. Possible reactions include oxidation and polymerization. The oxidation reaction is encouraged by the presence of oxygen in the plasma. With an increase in oxygen-to-siloxane ratio in the feed, the coating deposited showed an increased oxygen content and a decreased carbon content as measured by X-ray photoelectron spectroscopy. Beyond a certain oxygen-to-siloxane ratio, totally inorganic oxide coatings were obtained. For oxygen to HMDSO ratio of about 5:1 produced an essentially carbon-free coating of silicon oxide.

Polymerization of siloxane is a competing chemical reaction which can form a clear adherent coating from siloxane alone in the absence of oxygen. Plasma assisted polymerization of siloxane is also well documented in the PECVD literature. In the presence of oxygen, however, oxidation be the dominant reaction in the formation of silicon oxide and consumption of siloxane.

It is believed that chemical reactions occur in the gas phase, but it is also possible that the reaction continues at the surface of the substrate. Chemical reactions require the collision of reactants. Therefore, the higher the pressure the higher the probability of reaction. The pressure along the plasma channel drops from above 200 torr at the argon inlet to as low as 0.03 torr in the chamber, with major transition taking place in the arc and the nozzle-injector. The reaction zone is therefore primarily in the nozzle-injector, downstream from the injection point of siloxane. The substrate surface is another place where collision of species occurs.

The argon plasma contributes to the activation of oxygen and siloxane. The arc is known for its high plasma density and ionization efficiency, and is generally referred to as a thermal plasma approaching local thermodynamic equilibrium.

TABLE 7

Typical Abrasion-Resistant Coatings on Polycarbonate with Hardcoat

| Run no. | G95 | G202 | G265 | G255 | G297 |
|---|---|---|---|---|---|
| Apparatus | | | | | |
| Arc[a] | 8C(4 mm) | 8C(4 mm) | 3D(3,4,5 mm) | 3D(3,4,5 mm) | 1D(2–5 mm) |
| Nozzle-injector[b] | 25° 2-stage | 25° 4"conic | 40° 4" conic | 40° 4" conic | 40° 4" trombone |
| Operating conditions | | | | | |
| Working distance[c] (cm) | 38 | 25.5 | 23 | 25.5 | 25.5 |
| Substrate. temp (° C.) | 25 | 80 | 80 | 80 | 80 |
| Arc current (A) | 61 | 60 | 61 | 60 | 60 |
| Arc voltage (V) | 77 | 77 | 42 | 42 | 30 |
| Pressure (torr) | 0.17 | 0.16 | 0.11 | 0.14 | 0.03 |
| Siloxane used | HMDSO | TMDSO | TMDSO | D4 | D4 |
| Flow rate (l/min) Ar/O$_2$/siloxane[d] | 2/0.62/0.12 | 1.5/0.8/0.18 | 1/0.4/0.14 | 1/0.81(80° C.) | 1.5/0.8/(80° C.) |
| Results | | | | | |
| Dep. rate[e] ($\mu$m/min) | 8 | 12 | 8 | 21 | 14 |
| Coating area (cm dia) | <10 | 10 | >40 | >40 | >40 |
| Thickness[3] ($\mu$m) | 1.4 | 2.0 | 1.3 | 1.8 | 2.0 |
| Coating performance | | | | | |
| $_\Delta$Haze at 1,000 Taber cycles (CS-10F) | 3.5 | 2.9 | 3.7 | 3.9 | 1.6 |
| Water soak (65° C., 10 day) | — | pass | pass | pass | pass |
| Thermal cycling | — | pass | pass | pass | pass |

[a]The 8C(4 mm) is a 8-plate arc with a 4 mm cylindrical arc channel. The 3D(3,4,5 mm) is a 3-plate arc with a stepwise expanding channel at 3, 4, and 5 mm. The 1D(2–5 mm) is a 1-plate arc with a divergent arc channel expanding from 2 to 5 mm in diameter.
[b]A nozzle-injector may consist of a main body with 2 shower injection rings, an adapter to the anode with or without an oxygen slit injector, and an extension that expands toward the substrate. The 25° 2-stage is a nozzle-injector with an anode adapter expanding from 4 to 11 mm, followed by a cylindrical section at 11 mm dia, and a main body expanding at 25°. The 25° -4 inch conic is a nozzle-injector expanding at a total angle of 25° throughout, with an anode adapter with oxygen injection and a conic extension 4" long. The 40° -4 inch conic is a nozzle-injector expanding at 40° throughout, with an anode adapter with oxygen injection and a conic extension 4 inches long. The 40° -4 inch trombone is a nozzle-injector similar to the 40° -4" conic except that the extension flares out more by using a 4 inch section cut out from a trombone.
[c]Working distance is the distance from anode to substrate.
[d]D4 flow rate was not measured but was controlled by keeping the liquid temperature constant at 80° C.
[3]Average of 10 cm diameter area at center.

What is claimed is:

1. A method for depositing an adherent coating onto the surface of a substrate by plasma deposition which comprises passing a plasma gas through a direct current arc plasma generator to form a plasma, injecting a reactant gas and an oxidant into a diverging nozzle-injector extending from the plasma generator into a vacuum chamber towards the substrate which is positioned in the vacuum chamber, whereby reactive species formed by the plasma from the oxidant and reactant gas contact the surface of the substrate for a period of time sufficient to form the adherent coating.

2. A method according to claim 1 in which the adherent coating is a metal oxide.

3. A method according to claim 1 wherein the adherent coating is an oxide of silicon, titanium, or zinc.

4. A method according to claim 1 in which the adherent coating is zinc oxide.

5. A method according to claim 1 in which the adherent coating is titanium dioxide.

6. A method according to claim 1 in which the reactant gas is an organosilicon.

7. A method according to claim 1 in which the reactant gas is selected from the group consisting of silanes, disilanes, and organosilicon compounds.

8. A method according to claim 7 in which the reactant gas is selected from the group consisting of tetramethyldisiloxane, hexamethyldisiloxane, tetraethyl orthosilicate, hexamethyldisilane, octamethylcyclotetrasiloxane, and tetramethylcyclotetrasiloxane.

9. A method according to claim 8 in which the reactant gas is octamethylcyclotetrasiloxane.

10. A method according to claim 1 in which the plasma generator is a cascaded arc plasma torch having at least one electrically isolated plate.

11. A method according to claim 1 in which the plasma generator is a cascaded arc plasma torch having a plurality of electrically isolated plates.

12. A method according to claim 1 in which the plasma is a wall-stabilized plasma.

13. A method according to claim 1 in which the adherent coating is an abrasion-resistant coating having a silicon oxide-based composition comprising silicon, oxygen, carbon, and hydrogen.

14. A method according to claim 1 in which the adherent coating is an ultraviolet radiation absorbing coating consisting essentially of zinc oxide, titanium dioxide, or mixtures thereof.

15. A method according to claim 1 in which the substrate is glass.

16. A method according to claim 1 in which the substrate is a thermoplastic resin.

17. A method according to claim 1 in which the substrate is polycarbonate.

18. A method according to claim 1 in which the substrate comprises a plastic material, and the temperature of the substrate is maintained below the glass transition temperature of the plastic material during formation of the adherent coating.

19. The method of claim 1, wherein the nozzle injector includes at least two ring-shaped gas distributors for the injection of at least two reactant gases.

20. The method of claim 1, wherein the arc plasma generator has a conical bore which increases in diameter in a flow direction.

21. The method of claim 1, wherein the nozzle injector has a conical inner surface which increases in diameter in a flow direction.

22. The method of claim 1, further comprising the step of heating the nozzle injector to prevent condensation of the reactant gas.

23. The method of claim 1, further comprising the step of selecting a working distance between the surface of the substrate and the anode of between 15 and 70 centimeters.

24. The method of claim 1, further comprising the step of providing at least one cascade plate in the arc plasma generator between an anode and a cathode of the arc plasma generator.

25. A The method of claim 1, further comprising the step of injecting said oxidant into the plasma upstream of the reactant gas.

26. The method of claim 1, further comprising the step of controlling a temperature of a support which supports the substrate in the vacuum chamber.

27. The method of claim 1, further comprising the step of exposing the substrate to an oxygen/argon plasma prior to injection of the reactant gas.

28. The method of claim 1, wherein the plasma deposition has a duration of 3–60 seconds.

29. The method of claim 1, wherein the plasma deposition is carried out without direct cooling of the substrate.

30. The method of claim 1, further comprising the step of varying a feed rate of at least one of the oxidant the reactant gas to form the adherent coating with a graded composition.

31. The method of claim 1, wherein the adherent coating comprises silicon, oxygen, carbon, and hydrogen.

32. The method of claim 1, wherein the adherent coating comprises an ultraviolet radiation filter.

33. The method of claim 1, wherein the adherent coating exhibits a haze increase of less than about 2% after 1000 cycles of Taber abrading by a pair of CS10 F wheels with of load of 500 g per wheel.

34. The method of claim 1, further comprising the step of coating the substrate with a primer layer prior to plasma deposition.

35. The method of claim 34, wherein the primer layer comprises silicone.

36. The method of claim 1, wherein the reactant gas comprises hexamethyldisiloxane.

37. The method of claim 1, wherein the reactant gas comprises titanium isopropoxide.

38. The method of claim 1, wherein the reactant gas comprises at least one of diethyl zinc and dimethyl zinc.

39. A method of coating a substrate comprising the steps of:
   forming an arc plasma with a direct current between an anode and a cathode in an arc plasma generator;
   reducing a pressure in a vacuum chamber in fluid communication with the arc plasma generator so that the plasma flows into the vacuum chamber;
   introducing an oxidant into the plasma through a diverging nozzle injector which extends into the vacuum chamber toward the substrate from the anode of the plasma generator;
   introducing a silicon containing gas into the plasma through the nozzle injector;
   reacting the silicon containing gas with the oxidant in the nozzle injector; and
   projecting the silicon containing gas and the oxidant onto the substrate to coat the substrate.

40. The method of claim 39, wherein the silicon containing gas comprises an organosilicon compound.

41. The method of claim 39, wherein the silicon containing gas comprises a siloxane.

42. The method of claim 41, wherein the oxidant comprises oxygen.

43. The method of claim 39, wherein the oxidant comprises nitrous oxide.

44. The method of claim 39, wherein the plasma generator has a conical bore.

45. The method of claim 39, wherein the oxidant is injected upstream of the silicon containing gas.

46. The method of claim 39, further comprising the step of varying a ratio of oxidant flow rate to silicon containing gas flow rate to produce a coating having a graded composition.

47. A method of coating a substrate comprising the steps of:
   forming an arc plasma with a direct current between an anode and a cathode in an arc plasma generator having at least one cascade plate between the anode and the cathode;
   reducing a pressure in a vacuum chamber in fluid communication with the arc plasma generator so that the plasma flows into the vacuum chamber;

introducing an oxidant into the plasma through a diverging nozzle injector which extends into the vacuum chamber toward the substrate from the anode of the plasma generator;

introducing a reactant gas into the plasma through the diverging nozzle injector;

reacting the reactant gas with the oxidant in the nozzle injector; and projecting the reactant gas and the oxidant onto the substrate to coat the substrate.

* * * * *